(12) United States Patent
Mies

(10) Patent No.: US 7,956,763 B2
(45) Date of Patent: Jun. 7, 2011

(54) FAULTED CIRCUIT INDICATOR DEVICE HAVING AN IMPROVED CLAMPING MECHANISM

(76) Inventor: Johannes Mies, Koerperich (DE)

( * ) Notice: Subject to any disclaimer, the term of this patent is extended or adjusted under 35 U.S.C. 154(b) by 286 days.

(21) Appl. No.: 12/395,305

(22) Filed: Feb. 27, 2009

(65) Prior Publication Data

US 2010/0218715 A1 Sep. 2, 2010

(51) Int. Cl.
*G08B 21/00* (2006.01)
(52) U.S. Cl. .............. 340/664; 340/10.41; 340/540; 340/635; 340/638; 340/606; 340/653; 340/686.1; 324/117 R; 324/126; 324/127; 324/133; 324/551
(58) Field of Classification Search .......... 340/664, 340/10.41, 540, 606, 635, 653, 686.1; 324/117 R, 324/126, 127, 133, 551
See application file for complete search history.

(56) References Cited

U.S. PATENT DOCUMENTS

| 5,729,125 | A  | * | 3/1998 | Schweitzer, Jr. ............. 324/127 |
| 5,748,095 | A  |   | 5/1998 | Horstmann |
| 6,963,197 | B1 | * | 11/2005 | Feight et al. ................. 324/126 |
| 2009/0009274 | A1 | | 1/2009 | Horstmann |

* cited by examiner

*Primary Examiner* — Tai T Nguyen
(74) *Attorney, Agent, or Firm* — Davis M. Chin, Jr.; Davis Chin

(57) ABSTRACT

A faulted circuit indicator device for mounting on an overhead conductor cable for electrical power distribution systems to detect an abnormally high electric current therein includes a housing having an enclosure formed therein and current sensing circuitry for detecting the presence of the abnormally high electric current in the cable. An indication unit is responsive to the current sensing circuitry to produce a visual indication in the presence of the abnormally high electrical current. A clamping mechanism formed of a yoke and a pair of opposed pressure plates is disposed above the housing for securely mounting the cable therein to detect the abnormally high electric current. Compression springs are provided for resiliently urging the pair of opposed pressure plates upwardly for automatically trapping the cable in a fixed central position between the yoke and the pair of opposed pressure plates.

20 Claims, 4 Drawing Sheets

US 7,956,763 B2

FAULTED CIRCUIT INDICATOR DEVICE HAVING AN IMPROVED CLAMPING MECHANISM

BACKGROUND OF THE INVENTION

1. Field of Invention

This invention relates generally to short-circuit or faulted circuit indicator (FCI) apparatuses for use in electrical power distribution systems. More particularly, it relates to a faulted circuit indicator device which has an improved clamping mechanism of a unique physical construction so as to reduce mechanical stress on an electrical cable during mounting and removal of the faulted circuit indicator device and to automatically secure the cable in a central position.

2. Description of the Prior Art

As is generally known in the art, there exist a number of faulted circuit indicator devices for use in electrical power distribution systems to monitor circuit conditions in order to detect and determine the location of malfunctions occurring in the system. In particular, such prior art faulted circuit indicator devices are of the clamp-on type which typically includes a housing having fault monitor circuitry responsive to an abnormally high electric current, an indicator unit, and a clamping mechanism for mounting the housing onto overhead power lines, electrical conductor cables, bus bars, and the like. In addition, the faulted circuit indicator devices are generally installed or mounted about the energized conductor cable to be monitored by the use of a conventional shot-gun stick. The shot-gun stick is sometimes referred to as a "hot-stick" which is utilized to separate a spring-biased clamping mechanism for mounting the faulted circuit indicator device over and onto the energized conductor cable.

One such prior art faulted circuit indicator device of the clamp-on type is described and illustrated in U.S. Patent Application Publication No. 2009/0009274 to H. Horstmann published on Jan. 8, 2009 and assigned to the same assignee as the present invention. This Publication No. 2009/0009274 shows a short-circuit indicator for arrangement on an electrical line for electrical power distribution which includes a current transformer. The current transformer has an induction coil and an iron yoke for surrounding the electrical line to be monitored for a short-circuit current. The induction coil is seated on a base web of a U-shaped first yoke part. A second yoke part is connected in the form of a joint which can move between a closed position and an open position to one of two U-limbs of the first yoke part. The second yoke part forms a magnetic return path element for the first yoke part in the closed position. The first yoke part is split into two-essentially L-shaped parts in the area of the base web to which the induction coil is fitted.

Further, there is illustrated in FIG. 8 of the drawings and labeled as "Prior Art" a faulted circuit indicator device 110 of the clamp-on type made by and also assigned to the assignee of the instant invention, which is mounted about an overhead cable or conductor 112 in which the current passing therethrough is to be monitored. As can be seen, the faulted circuit indicator device 110 is comprised of essentially rectangular-shaped housing 114, a pair of C-shaped clamp arms 116 (only one is shown), a spring-biased clamp arm 118, a wire/spring bail 120, and an indicator unit 122. The cable 112 is sandwiched between the C-shaped clamp arms 116 and the spring-biased clamp arm 118. The wire bail 120 extends from the lower end of the housing 114 and is pullable by the conventional shot-gun stick for installation onto the cable.

One of the disadvantages of the prior art device of FIG. 8 is that a substantial amount of mechanical stress is created on the cable by the spring-biased clamp arm 118 during mounting and removal of the faulted circuit indicator device 110. In particular, when mounting the faulted circuit indicator device mechanical stress is created since the cable 112 must be pushed upwardly with a strong force against the spring-biased clamp arm 118. Similarly, when removing the faulted circuit indicator device mechanical stress is created since the cable 112 must be pulled downwardly with a strong force against the spring-biased clamp arm 118. Another disadvantage is that the cable 112 is not always secured horizontally in the C-shaped clamp arms 116 in a central position during installation.

It would be desirable to provide a faulted circuit indicator device which is designed with an improved clamping mechanism so as to relieve or reduce mechanical stress on the cable during its installation or removal. Further, it would be expedient that the clamping mechanism of the faulted circuit indicator secures automatically the cable horizontally in a central position.

The present invention represents a significant improvement over the aforementioned Publication No. 2009/0009274 and the prior art device of FIG. 8. The faulted circuit indicator device of the present invention includes an improved clamping mechanism formed of a yoke and a pair of opposed pressure plates for automatically holding horizontally a cable therebetween in a fixed central position.

SUMMARY OF THE INVENTION

Accordingly, it is a general object of the present invention to provide a faulted circuit indicator device having an improved clamping mechanism which is relatively simple and economical to manufacture and assemble, but yet overcomes the disadvantages of the prior art devices.

It is an object of the present invention to provide a faulted circuit indicator device which is designed with an improved clamping mechanism so as to relieve or reduce mechanical stress on a cable during its installation or removal.

It is another object of the present invention to provide a faulted circuit indicator device which includes an improved clamping mechanism that secures automatically a cable horizontally in a central position.

It is still another object of the present invention to provide a faulted circuit indicator device which includes a clamping mechanism formed of a yoke and a pair of pressure plates for automatically holding horizontally a cable therebetween in a secure central position.

In accordance with these aims and objectives, the present invention is concerned with the provision of a faulted circuit indicator device for mounting on an overhead conductor cable for electrical power distribution systems to detect an abnormally high electric current therein which includes a housing formed of front and back walls, opposed side walls, and a closed bottom wall, all being integrally connected together so as to define an enclosure. Current sensing circuitry is disposed in the housing enclosure for detecting the presence of the abnormally high electric current in the overhead conductor cable. An indication unit is joined to the closed bottom wall of the housing and is responsive to the current sensing circuitry to produce a visual indication in the presence of the abnormally high electrical current.

A clamping mechanism is disposed above the housing for securely mounting the cable therein to detect the abnormally high electric current. The clamping mechanism is formed of a yoke and a pair of opposed pressure plates. Compression spring means are provided for resiliently urging the pair of opposed pressure plates upwardly for automatically trapping the cable in a fixed central position between the yoke and the pair of opposed pressure plates.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
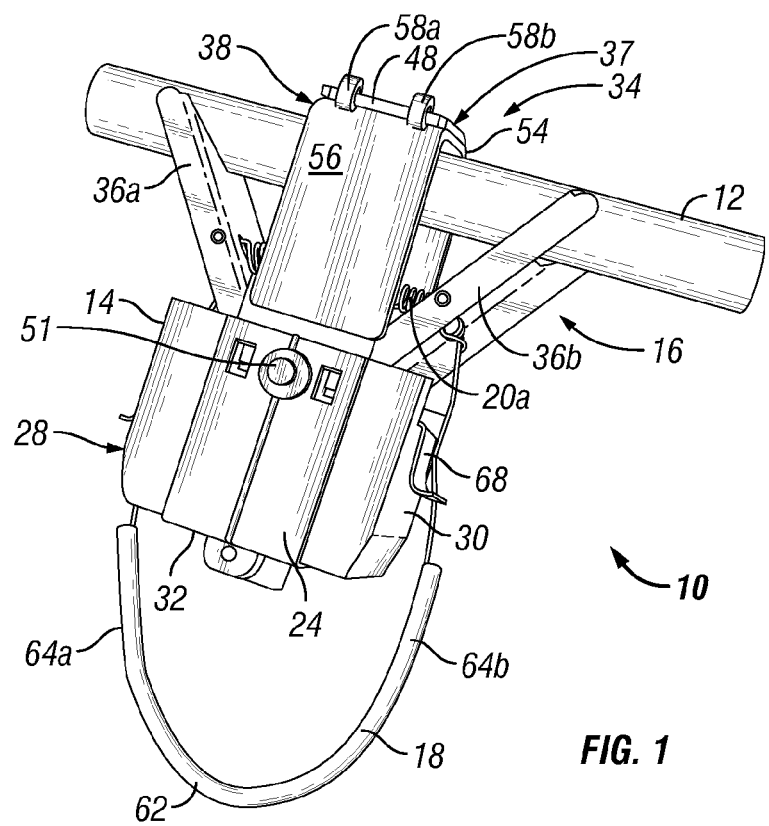
FIG. 1 is a front, perspective view of a faulted circuit indicator device with the yoke closed, constructed in accordance with the principles of the present invention.

It is to be distinctly understood at the outset that the present invention shown in the drawings and described in detail in association with a faulted circuit device for use in electrical power distribution systems is not intended to serve as a limitation upon the scope or teachings thereof, but is to be considered merely for the purpose of convenience of illustration of one example of its application.

Referring now in detail to the various views of the drawings in FIGS. 1 through 6 of the drawings, there is illustrated a faulted circuit indicator device having an improved clamping mechanism which is designated generally by reference numeral 10 and is constructed in accordance with the principles of the present invention. The faulted circuit indicator device 10 is designed to be of a unique, simplified construction, which is relatively simple to manufacture and assemble. The faulted circuit indicator device 10 is of the clamp-on type which houses suitably current sensing circuitry for detecting when an abnormally high electric current occurs in an energized overhead power line or cable 12 and an indication unit responsive to the current sensing circuitry for producing a visual indication of the presence of the fault.

As can be best seen from FIGS. 1-4, the faulted circuit indicator device 10 is formed of a substantially rectangular-shaped housing 14, a unique clamping mechanism 16, a wire/spring bail 18, a pair of compression springs 20a, 20b, and an indication unit 22. The housing 14 is used to encapsulate the current sensing circuitry and the indication unit. The housing is preferably formed of a durable material such as a molded plastic material or the like. The rectangular-shaped housing 14 includes opposed front and back walls 24 and 26; opposed side walls 28, 30; and a closed bottom wall 32, all formed integrally together to define an enclosure for receiving the current sensing circuitry and the indicator unit therein. While the housing has been illustrated to be rectangular in shape, it should be apparent to those skilled in the art that the housing may be formed of a square, oval, elliptical, or circular shape as well.

Figure 2:
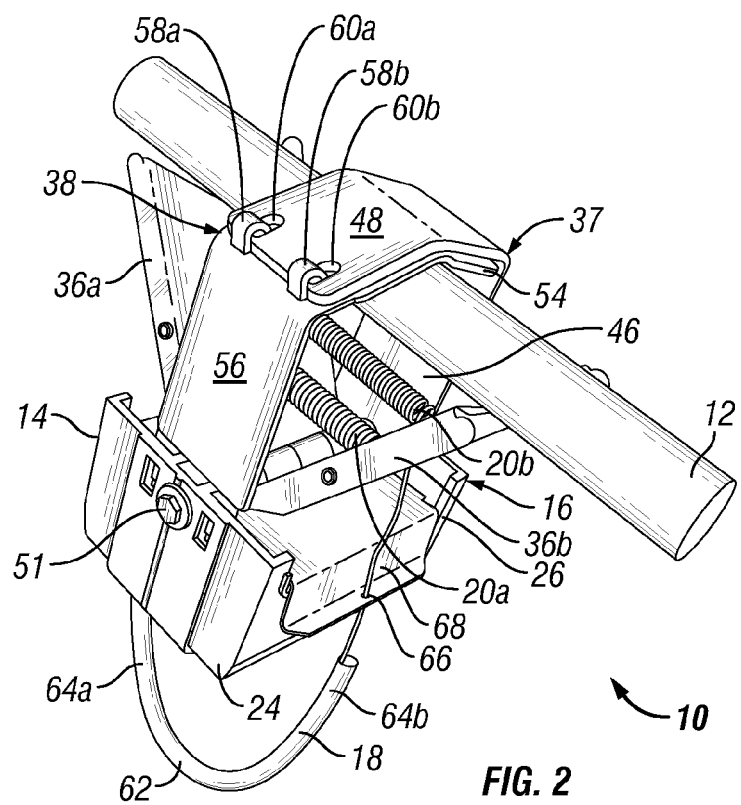
FIG. 2 is a top, perspective view of a faulted circuit indicator device with the yoke closed, of the present invention.
Figure 3:
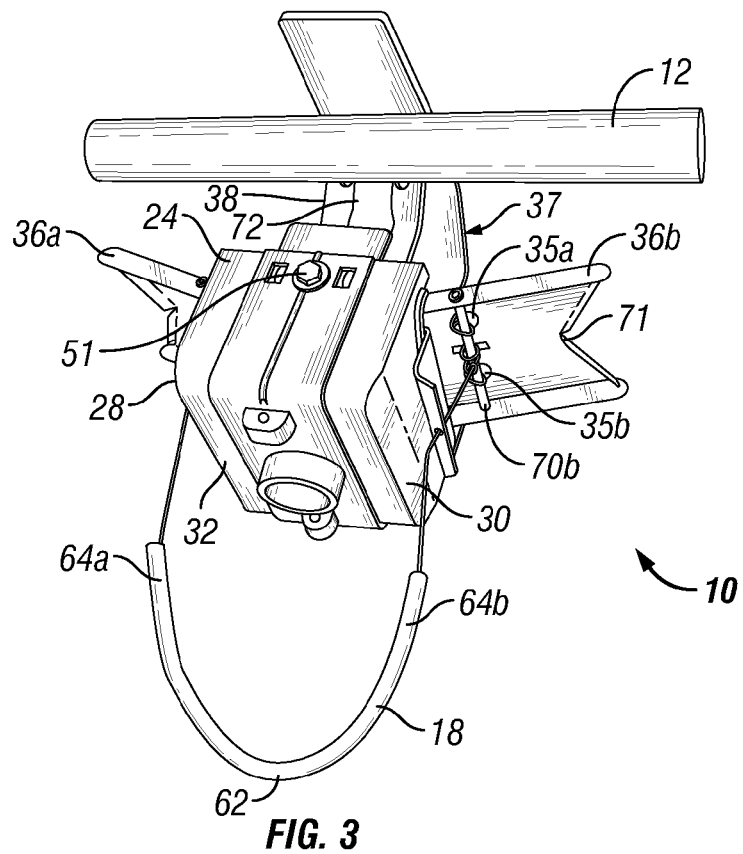
FIG. 3 is a front, perspective view of a faulted circuit indicator device with the yoke opened, in accordance with the present invention.
Figure 4:
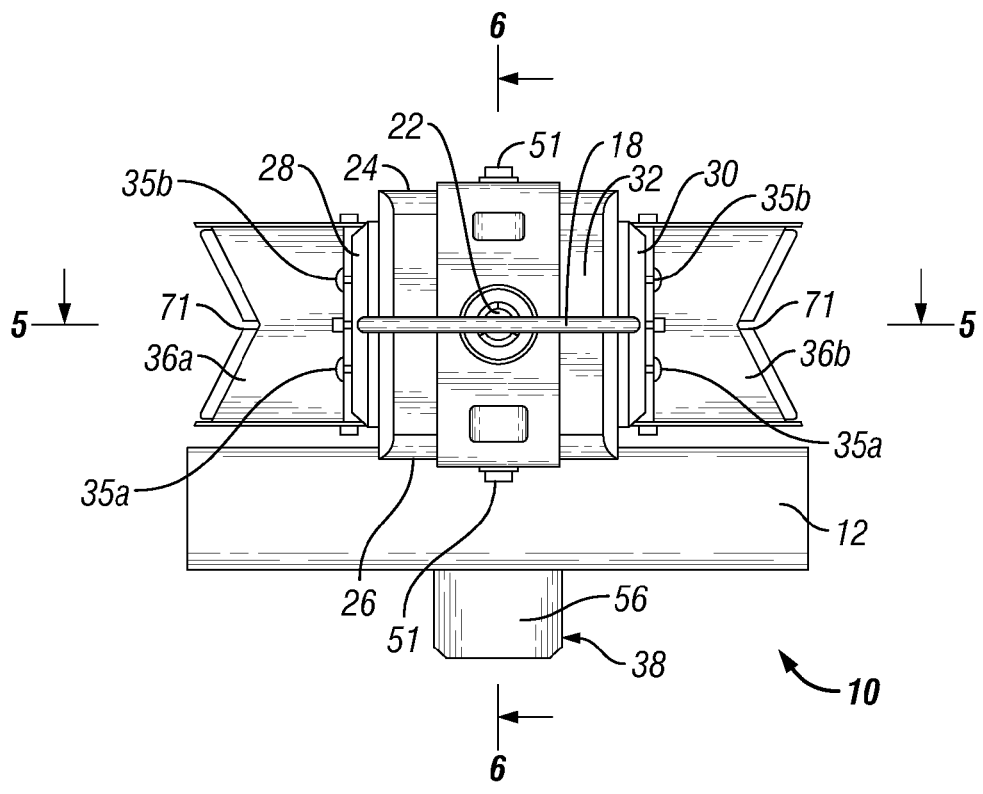
FIG. 4 is a bottom, plan view of the faulted circuit indicator device of FIG. 3.
Figure 5:
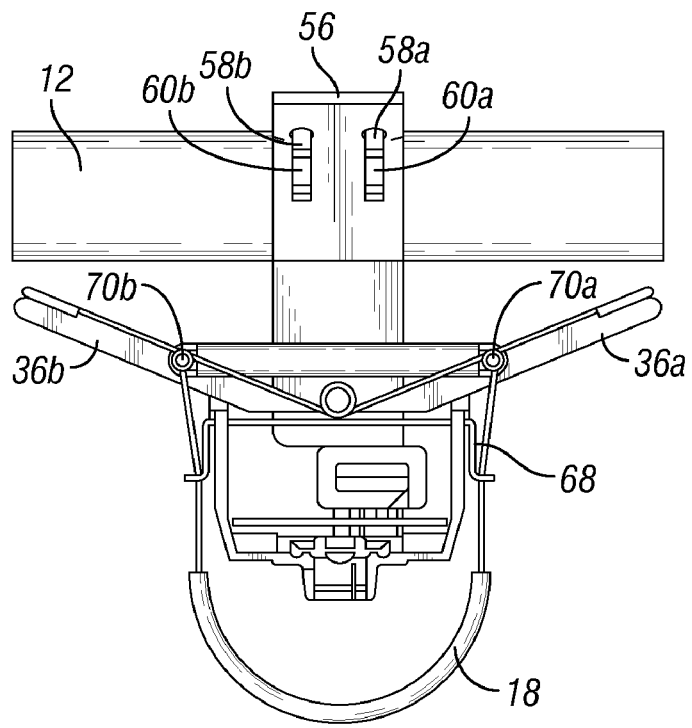
FIG. 5 is a cross-sectional view of the faulted circuit indicator device of FIG. 4, taken along the lines 5-5.

The unique clamping mechanism 16 of the present invention is comprised of a yoke 34 and a pair of pressure plates 36a, 36b. As shown generally in FIGS. 1-4 and in detail in FIGS. 5 and 6, the yoke 34 is formed of a first part 37 and a second part 38 which allows the faulted circuit indicator device 10 to be fitted around the conductor cable 12 during use and to be removed from it. The second part 38 of the yoke 34 is hingedly connected to the first part 37 so that it is movable between a first or closed position as shown in FIGS. 1 and 2 and a second or open position as depicted in FIGS. 3 and 4.

Figure 6:
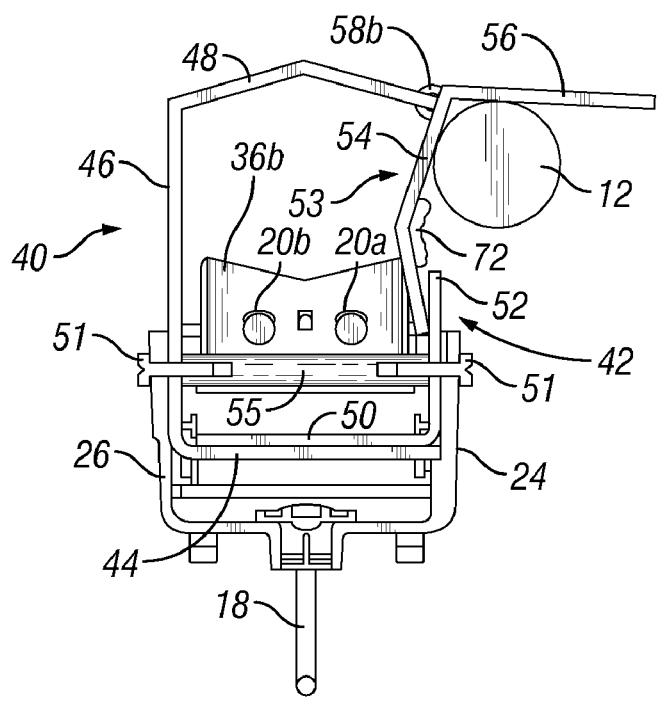
FIG. 6 is a cross-sectional view of the faulted circuit indicator device of FIG. 4, taken along the lines 6-6.

Referring specifically to FIG. 6, the first part 37 of the yoke 34 is preferably formed of a substantially C-shaped member 40 and a L-shaped member 42. The C-shaped member 40 includes a lower horizontal element 44, an upright element 46, and an upper inverted V-shaped horizontal element 48. The L-shaped member 42 also includes a lower horizontal element 50 and a short upright element 52. The lower horizontal elements 44 and 50 are arranged in a parallel relationship to each other, one on top of the other, and extend between the front and back walls 24, 26 of the housing 14. The upright elements 52 and 46 are held against the respective front and back walls 24, 26 by bolts 51. The bolts 51 are affixed in a central spacer 55 which is used to precisely locate and secured the yoke 34 between the front and back walls of the housing 14. The longitudinal axis of the central spacer 55 serves as an axis about which the pair of pressure plates 36a, 36b pivot.

The second part 38 of the yoke 34 is formed of a substantially L-shaped member 53 having a vertical inverted V-shaped element 54 and a horizontal element 56, as viewed in the open position of FIGS. 3 and 4-6. The second part 38 is pivotally connected by way of the hinge elements 58a, 58b to the free end of the upper horizontal element 48 of the first part 37 at the junction between the vertical element 54 and the horizontal element 56 thereof. Each of the hinge elements 58a, 58b is preferably stamped out of the material from the vertical element 54 of the second part 38 of the yoke 34 and is bent upwardly to serve as a curved hinge holder. Adjacent to the edge of the free end of the upper horizontal element 48 of the first part 37 of the yoke 34, there are provided openings 60a, 60b which are aligned and receive the hinge elements 58a, 58b, thereby defining hinged joints.

With attention directed again to FIGS. 1-4, the wire/spring bail 18 has a generally U-shape configuration and is preferably formed of a metallic material such as stainless steel or the like. The intermediate portion 62 of the bail functions as a handle which is pullable by a conventional shot-gun stick for installation of the faulted circuit indicator device over and onto the energized conductor cable 12. The opposing arms 64a, 64b of the bail extend through respective openings 66 in a support plate 68, preferably formed of aluminum, are secured around rods 70a, 70b. The support plate 68 not only serves to guide the wire arms 64a, 64b of the bail when attaching it to the rods, but also protect the housing 14 against a source of incoming UV-light rays from damaging it.

Each of the pair of pressure plates 36a, 36b are arranged above the top of the housing and extends upwardly and outwardly at approximately a 45 degree angle when the yoke 34 is in the closed position of FIGS. 1 and 2. The rods 70a, 70b are fixedly secured to the underneath side of the respective pressure plates 36a, 36b. The upper free ends of the pressure plates are provided with V-shaped cut-outs 71 so as to support the lower side of the cable horizontally and to secure it in a central position in the closed position. Each of the compression springs 20a, 20b has a first end fixedly secured to the rod 70a via corresponding holes 35a, 35b formed in the pressure plate 36a and a second end fixedly secured to the rod 70b via the corresponding holes 35a, 35b formed in the pressure plate 38b. Due to the resulting compression force of the springs, the pressure plates will be resiliently urged upwardly so that its V-shaped cut-outs 71 will contact engagingly against the lower sides of the cable, thereby automatically maintaining the cable to be horizontal in the fixed central position.

In order to install the device over and onto the cable, the user such as a lineman merely utilizes the conventional shotgun stick which is operatively attached to the bail 18 of the fault circuit indicator device 10 in FIGS. 1 and 2 for pulling it downwardly so as to cause the pressure plates 36a, 36b via the rods 70a, 70b to move downward against the force of the compression springs 20a, 20b. As a result, the second part 38 of the yoke 34 will be pivoted outwardly so that the free end of its vertical element 54 abuts the free end of the upright element 52 of the first part 37 of the yoke, as shown in FIGS. 3 and 6. This creates a surface contact area at the junction of the horizontal and vertical elements 56, 54 of the second part 38 of the yoke for engagement with the cable 12.

Figure 8:
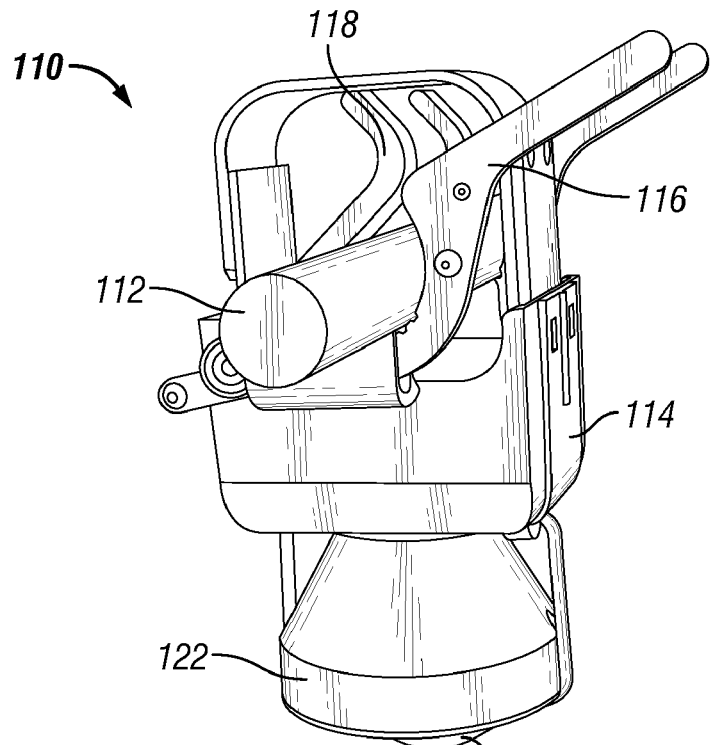
FIG. 8 is a front, perspective view of a prior art faulted circuit indicator device and has been labeled "PRIOR ART".

Once the surface contact area is placed into engagement by a soft touching with the cable, the second part 38 of the yoke will be pivoted inwardly via the hinges 58a, 58b to cause the vertical inverted V-shaped element 54 thereof to be urged below the horizontal inverted V-shaped element 48 of the first part 37 in an overlapping relationship with the cable being disposed underneath. When the downward pulling force is released from the compression springs 20a, 20b, the cable 12 will be automatically trapped or sandwiched between the inverted V-shaped elements 48 and 54 of the yoke and the V-shaped cut-outs 71 of the pressure plates 36a, 36b, thereby securing the cable in a fixed central position. It will be noted that substantially no mechanical stress is placed on the conductor cable 12 during this installation. Unlike the prior art of FIG. 8, a strong upward force is not required to push the cable up during mounting, thus the present invention creates no mechanical stress on the cable.

Figure 7:
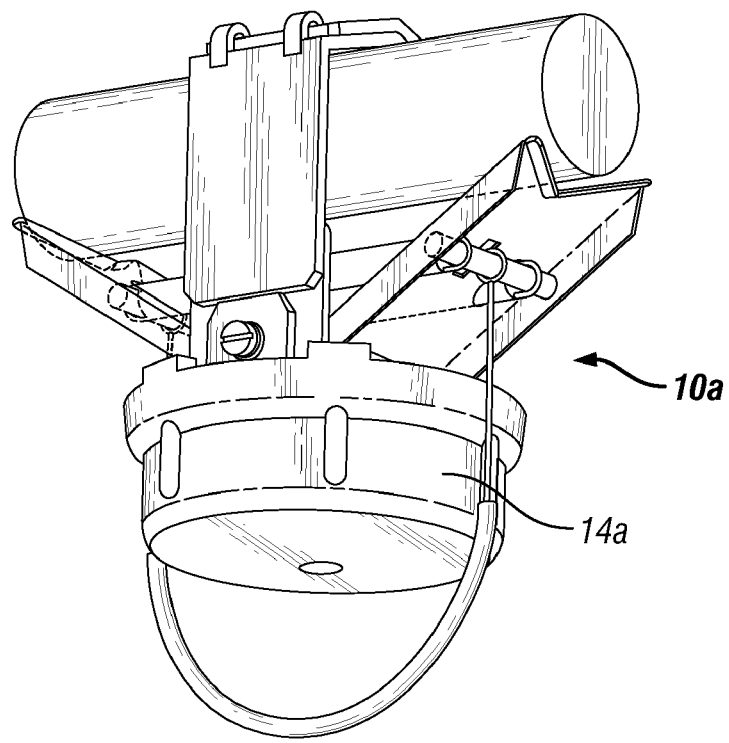
FIG. 7 is a front, perspective view of a second embodiment of a faulted circuit indicator device of the present invention.

In FIG. 7, there is illustrated a second embodiment of a faulted circuit indicator device 10a of the present invention. FIG. 7 is a front, perspective view of the faulted circuit indicator device 10a, similar to FIG. 1. The faulted circuit indicator device 10a is substantially identical to the device 10 of FIGS. 1-6, except that the housing 14a is formed of a circular configuration in its construction. In view of this, it is believed that a detailed discussion of this second embodiment is not necessary.

From the foregoing detailed description, it can be seen that the present invention provides a faulted circuit indicator device for mounting on an overhead conductor cable for electrical power distribution systems to detect an abnormally high electric current therein which includes an improved and unique clamping mechanism disposed above a housing for securely mounting the cable therein to detect the abnormally high electric current. The clamping mechanism is formed of a yoke and a pair of opposed pressure plates. Compression springs are provided for resiliently urging the pressure plates upwardly for trapping automatically the cable in a fixed central position between the yoke and the pressure plates.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A faulted circuit indicator device for mounting on an overhead conductor cable for electrical power distribution systems to detect an abnormally high electric current therein, comprising:

a housing formed of front and back walls, opposed side walls, and a closed bottom wall, all being integrally connected together so as to define an enclosure;

current sensing circuitry disposed in said housing enclosure for detecting the presence of the abnormally high electric current in the overhead conductor cable;

an indication unit being joined to the closed bottom wall of said housing and being responsive to said current sensing circuitry to produce a visual indication in the presence of the abnormal high electrical current;

a clamping mechanism disposed above said housing for securely mounting the cable therein to detect the abnormally high electric current;

said clamping mechanism being formed of a yoke and a pair of opposed pressure plates; and compression spring means for resiliently urging said pair of opposed pressure plates upwardly for automatically trapping the cable in a fixed central position between said yoke and said pair of opposed pressure plates.

2. A faulted circuit indicator device as claimed in claim 1, wherein said yoke is formed of a first part and a second part which is hingedly connected to said first part so as to allow the faulted circuit device to be fitted around the cable during use and to be removed therefrom.

3. A faulted circuit indicator device as claimed in claim 2, wherein said first part of said yoke includes a substantially C-shaped member and a L-shaped member, said C-shaped member being formed of a lower horizontal element, an upright element, and an upper horizontal element, said L-shaped member being formed of a lower horizontal element and a short upright element.

4. A faulted circuit indicator device as claimed in claim 3, wherein said lower horizontal elements of said C-shaped member and said L-shaped member are disposed in a parallel relationship to each other, one on top of the other, and extend between the front and back walls of said housing.

5. A faulted circuit indicator device as claimed in claim 3, wherein said second part of said yoke includes a L-shaped member having a vertical element and a horizontal element, said second part being hingedly connected to the free end of said upper horizontal element of said C-shaped member of said first part of said yoke at the junction between said vertical and horizontal elements thereof.

6. A faulted circuit indicator device as claimed in claim 1, further comprising bail means operatively connected to said pair of opposed pressure plates and utilized with a convention shot-gun stick for pulling downwardly said pressure plates against the force of said compression springs means.

7. A faulted circuit indicator device as claimed in claim 1, wherein said pair of opposed pressure plates are arranged above said housing and extend upwardly and outwardly at approximately a 45 degree angle when said yoke is in the closed position.

8. A faulted circuit indicator device as claimed in claim 7, wherein the upper free ends of said pair of opposed pressure plates are provided with V-shaped cut-outs so as to support the lower side of the cable and to secure the cable in the central position when said clamping mechanism is in a closed position.

9. A faulted circuit indicator device as claimed in claim 1, wherein said compression spring means includes a pair of parallel spaced-apart compression springs, each of said compression springs having a first end fixedly secured to one of said pair of opposed pressure plates and having a second end thereof fixedly secured to the other of said pair of opposed pressure plates.

10. A faulted circuit indicator device for mounting on an overhead conductor cable for electrical power distribution systems to detect an abnormally high electric current therein, comprising:

housing means including an enclosure formed therein;
current sensing means disposed in said housing means for detecting the presence of the abnormally high electric current in the overhead conductor cable;
indicator means joined to said housing means and being responsive to current sensing means to produce a visual indication in the presence of the abnormally high electric current;
clamping means disposed above said housing means for securely mounting the cable therein to detect the abnormally high electric current;
said clamping means being formed of yoke means and pressure plate means; and
compression spring means for resiliently urging said pressure means upwardly for trapping automatically the cable in a fixed central position between said yoke means and said pressure plate means.

11. A faulted circuit indicator device as claimed in claim 10, wherein said yoke means is formed of a first part and a second part which is hingedly connected to said first part so as to allow the faulted circuit device to be fitted around the cable during use and to be removed therefrom.

12. A faulted circuit indicator device as claimed in claim 11, wherein said first part of said yoke means includes a substantially C-shaped member and a L-shaped member, said C-shaped member being formed of a lower horizontal element, an upright element, and an upper horizontal element, said L-shaped member being formed of a lower horizontal element and a short upright element.

13. A faulted circuit indicator device as claimed in claim 12, wherein said lower horizontal elements of said C-shaped member and said L-shaped member are disposed in a parallel relationship to each other, one on top of the other, within said housing means.

14. A faulted circuit indicator device as claimed in claim 12, wherein said second part of said yoke means includes a L-shaped member having a vertical element and a horizontal element, said second part being hingedly connected to the free end of said upper horizontal element of said C-shaped member of said first part of said yoke means at the junction between said vertical and horizontal elements thereof.

15. A faulted circuit indicator device as claimed in claim 10, further comprising bail means operatively connected to said pressure plate means and utilized with a conventional shot-gun stick for pulling downwardly said pressure plate means against the force of said compression springs means.

16. A faulted circuit indicator device as claimed in claim 10, wherein said pressure plate means includes a pair of pressure plates which are arranged above said housing means and extend upwardly and outwardly at approximately a 45 degree angle when said yoke means is in the closed position.

17. A faulted circuit indicator device as claimed in claim 16, wherein the upper free ends of said pair of opposed pressure plates are provided with V-shaped cut-outs so as to support the lower side of the cable and to secure the cable in the central position.

18. A faulted circuit indicator device as claimed in claim 10, wherein said compression spring means includes a pair of parallel spaced-apart compression springs, each of said compression springs having a first end fixedly secured to one of said pair of opposed pressure plates and having a second end thereof fixedly secured to the other end of said pair of opposed pressure plates.

19. A clamping mechanism for use with a faulted circuit indicator device for mounting on an overhead conductor cable for electrical power distribution systems to detect an abnormally high electric current therein, comprising:

clamping means for securely mounting the cable therein to detect the abnormally high electric current;
said clamping means being formed of yoke means and pressure plate means; and
compression spring means for resiliently urging said pressure means upwardly for trapping automatically the cable in a fixed central position between said yoke means and said pressure plate means.

20. A clamping mechanism as claimed in claim 19, wherein said clamping means is attachable to a faulted circuit device.

* * * * *